United States Patent
Chetry et al.

(10) Patent No.: US 12,290,900 B2
(45) Date of Patent: May 6, 2025

(54) METHODS FOR THINNING SUBSTRATES FOR SEMICONDUCTOR DEVICES

(71) Applicant: Qorvo US, Inc., Greensboro, NC (US)

(72) Inventors: Krishna Chetry, Richardson, TX (US); Ganesan Radhakrishnan, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/577,590

(22) PCT Filed: Mar. 27, 2023

(86) PCT No.: PCT/US2023/016353
§ 371 (c)(1),
(2) Date: Jan. 8, 2024

(87) PCT Pub. No.: WO2023/234998
PCT Pub. Date: Dec. 7, 2023

(65) Prior Publication Data
US 2024/0173813 A1 May 30, 2024

Related U.S. Application Data (60) Provisional application No. 63/347,340, filed on May 31, 2022.

(51) Int. Cl.
*B24B 7/22* (2006.01)
*B24B 37/00* (2012.01)
(Continued)

(52) U.S. Cl.
CPC .............. *B24B 7/228* (2013.01); *B24B 37/00* (2013.01); *B24B 37/005* (2013.01);
(Continued)

(58) Field of Classification Search
None
See application file for complete search history.

(56) References Cited

U.S. PATENT DOCUMENTS

2002/0187595 A1* 12/2002 Walitzki ............ H01L 21/76256
257/E21.569
2012/0289126 A1* 11/2012 Tanikella .................. B24D 5/06
451/41

(Continued)

OTHER PUBLICATIONS

Michael Raj Marks et al., "Ultrathin Wafer Pre-Assembly and Assembly Process Technologies: A Review," Critical Reviews in Solid State and Materials Sciences, vol. 40, No. 5, Sep. 3, 2015, pp. 251-290, Taylor & Francis Group, LLC.

(Continued)

*Primary Examiner* — Binh X Tran
(74) *Attorney, Agent, or Firm* — Withrow & Terranova, P.L.L.C.

(57) ABSTRACT

Methods and systems for thinning a device wafer to tens of micron, micron, or sub-micron thicknesses are disclosed. Device wafers are thinned by using a two-step grinding process and a chemical mechanical polish (CMP) process. One or more first grinding parameters associated with the first grinding process are determined, received, and/or adjusted before and/or during the performance of the first grinding process. One or more second grinding parameters associated with the second grinding process are determined, received and/or adjusted before and/or during the performance of the second grinding process. One or more polishing parameters associated with the CMP process are determined and/or adjusted before and/or during the performance of the CMP process.

13 Claims, 8 Drawing Sheets

(51) Int. Cl.
*B24B 37/005* (2012.01)
*B24B 37/04* (2012.01)
*B24B 41/06* (2012.01)
*H01L 21/306* (2006.01)

(52) U.S. Cl.
CPC ............ *B24B 37/042* (2013.01); *B24B 41/06* (2013.01); *H01L 21/30625* (2013.01)

(56) References Cited

U.S. PATENT DOCUMENTS

| | | |
|---|---|---|
| 2014/0113526 A1 | 4/2014 | Kipper et al. |
| 2022/0115226 A1* | 4/2022 | Sievilä ................. H01L 21/304 |
| 2022/0140227 A1* | 5/2022 | Bhattacharyya ..... H10N 30/708 |
| | | 310/358 |
| 2023/0005756 A1 | 1/2023 | Chetry et al. |

OTHER PUBLICATIONS

Chen Zhiwen et al., "Ultra-Thinning of 20 nm-Node DRAMs down to 3m for Wafer-on-Wafer (WOW) Applications," 2021 IEEE 71st Electronic Components and Technology Conference (ECTC), Jun. 1, 2021, pp. 1131-1137, IEEE.
International Search Report and Written Opinion for PCT/US2023/016353, mailed Jul. 18, 2023, 15 pages.

* cited by examiner

TABLE 1

| Z1 Axis | | | |
|---|---|---|---|
| Wheel | GF01-SDC320-BT300-50 | | |
| Spindle RPM | 3200 | | |
| Air Cut (um) | 50 | | |
| | Feed (um/s) | Amount (um) | C/T RPM |
| 1st Cut | 2.5 | As Suitable | 300 |
| 2nd Cut | 1.0 | 20 | 300 |
| 3rd Cut | 0.5 | 10 | 300 |
| 4th Cut | - | - | - |
| 5th Cut | - | - | - |
| Spark Out | 3 rev | | 300 |
| Escape Cut | 3.0 | 1.0 | 300 |
| Grinding Water (L/min) | Wheel | Inner Only | Extra |
| | - | 4 | - |

TABLE 2

| Z2 Axis | | | |
|---|---|---|---|
| Wheel | IF-01-9.4/6-BR361-100 | | |
| Spindle RPM | -3000 | | |
| Air Cut (um) | 25 | | |
| | Feed (um/s) | Amount (um) | C/T RPM |
| 1st Cut | 0.2 | 25 | -275 |
| 2nd Cut | 0.15 | 25 | -275 |
| 3rd Cut | - | - | - |
| 4th Cut | - | - | - |
| 5th Cut | - | - | - |
| Spark Out | 3 rev | | -275 |
| Escape Cut | 0.5 | 3 | -275 |
| Grinding Water (L/min) | Wheel | Inner Only | Extra |
| | - | 4 | - |

METHODS FOR THINNING SUBSTRATES FOR SEMICONDUCTOR DEVICES

CROSS-REFERENCE TO RELATED APPLICATION(S)

This application is a 35 USC 371 national phase filing of International Application No. PCT/US2023/016353, filed Mar. 27, 2023, which claims the benefit of U.S. provisional patent application No. 63/347,340, filed on May 31, 2022, and titled "METHODS FOR THINNING A SUBSTRATE FOR SEMICONDUCTOR DEVICES", the disclosures of which are incorporated herein by reference in their entireties.

FIELD OF THE DISCLOSURE

Embodiments of the disclosure generally relate to semiconductor devices and methods of manufacturing semiconductor devices. More particularly, embodiments of the disclosure relate to systems and methods for thinning substrates for semiconductor devices.

BACKGROUND

Many integrated circuits and electronic devices are formed in or on one or more substrates. Example substrates include silicon substrates, silicon-on-insulator (SOI) substrates, silicon carbide substrates, and gallium nitride substrates. In many instances, a substrate is thinned during fabrication of the integrated circuit or the electronic device. For example, in a three-dimensional (3D) integrated circuit where multiple substrates are stacked vertically over each other, one or more of the substrates are thinned to reduce the total height of the 3D integrated circuit and/or to reduce the interconnect lengths within the 3D integrated circuit (e.g., to reduce the lengths of through-silicon vias and signal lines). Reductions in the interconnect lengths can reduce power consumption, parasitic resistance, and/or parasitic capacitance in the 3D integrated circuit. However, the thinning process can result in significant variations in thickness across the substrate. Additionally or alternatively, the thinning process may result in the formation of defects in the thinner regions of the substrate.

SUMMARY

Embodiments disclosed herein provide methods for thinning a device wafer to tens of micrometers ("microns"), micron, or sub-micron (less than one (1) micron) thicknesses. In certain embodiments, the method includes operations of adhesive coating, carrier wafer bonding, a first grinding process, a second grinding process, and a chemical mechanical polish (CMP) process. The method disclosed herein can be used by systems to fabricate a variety of semiconductor devices.

One or more coating parameters associated with adhesive coating are received or determined to produce a uniform or substantially uniform thickness of the adhesive material over or across the device wafer. One or more first grinding parameters associated with the first grinding process can be determined, received and/or adjusted before and/or during the performance of the first grinding process. One or more second grinding parameters associated with the second grinding process may be determined, received, and/or adjusted before and/or during the performance of the second grinding process. The one or more first grinding parameters and the one or more second grinding parameters may each include, but are not limited to, a wheel type in the grinding tool, a revolutions per minute (rpm) of a stage of the grinding tool, a tilt of the stage of the grinding tool, or an rpm of a spindle of the grinding tool. In some instances, a first spindle is used in the first grinding process and a different second spindle is used in the second grinding process. In such embodiments, the rpm of the spindle is an rpm of the first spindle and an rpm of the second spindle.

One or more polishing parameters can be determined, received, and/or adjusted before and/or during the performance of the CMP process. The one or more polishing parameters can include, but are not limited to, a thickness profile for the device wafer, a slurry flow rate, an rpm of a polish head of a polishing tool, an rpm of a platen of the polishing tool, or one or more zonal pressures of the polish head in the polishing tool.

In one aspect, a method for thinning a device wafer includes performing a first grinding process to thin the device wafer from a first thickness to a second thickness, performing a second grinding process to thin the device wafer from the second thickness to a third thickness, and performing a chemical mechanical polish (CMP) process to thin the device wafer from the third thickness to a fourth thickness. At least one first grinding parameter associated with the first grinding process is adjusted during the performance of the first grinding process based on a first total thickness variation (TTV) of the device wafer. At least one second grinding parameter associated with the second grinding process is adjusted during the performance of the second grinding process based on a second TTV of the device wafer. At least one polishing parameter associated with the CMP process is adjusted during the performance of the CMP process based on a thickness profile for the device wafer.

In another aspect, a system includes a grinding tool, a CMP tool, and one or more processing devices connected to the grinding tool and the CMP tool. The one or more processing devices store instructions, that when executed by the one or more processing devices, cause operations to be performed. The operations include performing a first grinding process to thin the device wafer from a first thickness to a second thickness, performing a second grinding process to thin the device wafer from the second thickness to a third thickness, and performing a chemical mechanical polish (CMP) process to thin the device wafer from the third thickness to a fourth thickness. At least one first grinding parameter associated with the first grinding process is adjusted during the performance of the first grinding process based on a first total thickness variation (TTV) of the device wafer. At least one second grinding parameter associated with the second grinding process is adjusted during the performance of the second grinding process based on a second TTV of the device wafer. At least one polishing parameter associated with the CMP process is adjusted during the performance of the CMP process based on a thickness profile for the device wafer.

In yet another aspect, a method for thinning a device wafer includes thinning the device wafer from a first thickness to a second thickness, thinning the device wafer from the second thickness to a third thickness, and thinning the device wafer from the third thickness to a fourth thickness. At least one first grinding parameter associated with thinning the device wafer to the second thickness is adjusted during the thinning process based on a first total thickness variation (TTV) of the device wafer. At least one second grinding parameter associated with thinning the device wafer to the third thickness is adjusted during the thinning process based on a second TTV of the device wafer. At least one polishing parameter associated with thinning the device wafer to the fourth thickness is adjusted during the performance of the CMP process based on a thickness profile for the device wafer.

The system and method can thin device wafers to a thickness of tens of microns, one or more microns, or less than one (1) micron (e.g., a sub-micron thickness). The system and method can reduce or eliminate defects that can be formed in the device wafer, such as cracks and/or punch-through defects. Additionally, the system or method may reduce or eliminate issues such as delamination of the carrier wafer. In certain embodiments, the thinned device wafer has a total thickness variation (TTV) that is less than the thickness of the thinned device wafer. For example, a device wafer may be thinned to approximately 0.9 micrometers and have a TTV of 0.7 micrometers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
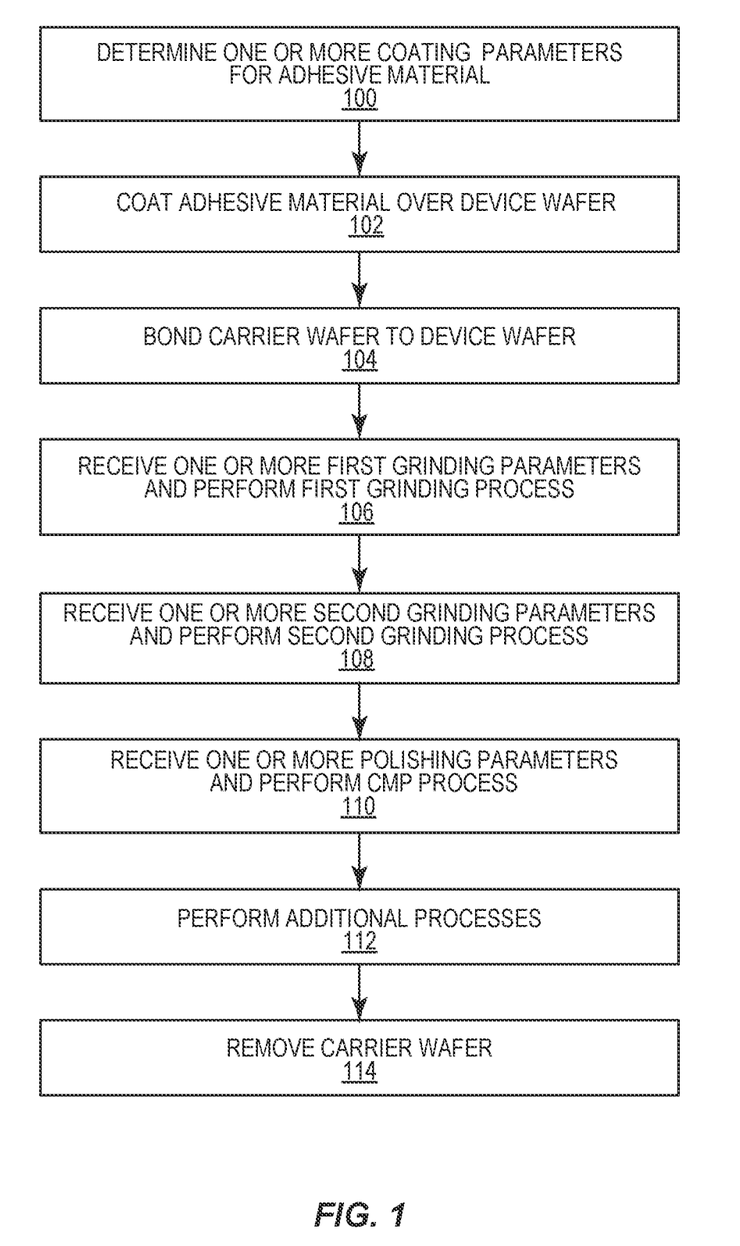
FIG. 1 illustrates an example method of thinning a device wafer in accordance with embodiments of the disclosure.

FIG. 1 illustrates an example method of thinning a device wafer in accordance with embodiments of the disclosure. The method thins a device wafer by using a two-step grinding process and a CMP process. The method can thin substrates, such as silicon substrates, to a thickness that is less than twenty (20) micrometers. In certain embodiments, the method may thin substrates to a thickness that is less than ten (10) micrometers or less than five (5) micrometers. In other embodiments, the method may thin a substrate to a thickness that is one (1) micrometer or less than one (1) micrometer (e.g., to a sub-micron thickness).

Initially, one or more coating parameters for an adhesive material are received or determined at block 100. The one or more coating parameters are based on improving or optimizing a thickness uniformity of the adhesive material on or across the device wafer and/or improving or optimizing a bonding strength that is to be achieved while a carrier wafer is bonded to the device wafer. The one or more coating parameters may also be based on maintaining the ability to remove or debond the carrier wafer from the device wafer. Non-limiting nonexclusive example coating parameters are a coating thickness of the adhesive material, a spin speed for coating the adhesive material onto the device wafer, a temperature of the adhesive material, and/or a viscosity of the adhesive material. In a non-limiting nonexclusive example, the adhesive material is BREWERBOND™ BB305 adhesive material from the Brewer Science Company, the coating thickness is approximately thirty (30) micrometers, the spin speed is between sixteen hundred (1600) and seventeen hundred (1700) revolutions-per-minute (rpm), and the viscosity and temperature are seven thousand, three hundred and thirty (7,330) centipoise at one hundred (100) degrees Fahrenheit.

Other types of adhesive materials can have one or more coating parameters that differ from these example coating parameters. In certain embodiments, the coating parameters are specific to a particular adhesive material and are determined by testing and analysis of the thickness uniformity of the adhesive material, the bonding strength of the adhesive material, and/or the debonding capability of the adhesive material.

Next, as shown in block 102, the adhesive material is coated over a surface of the device wafer. Although the adhesive material is described as being coated over the surface of the device wafer, in other embodiments the adhesive material may be coated over a surface of the carrier wafer, or over both the device wafer and the carrier wafer.

Figure 2:
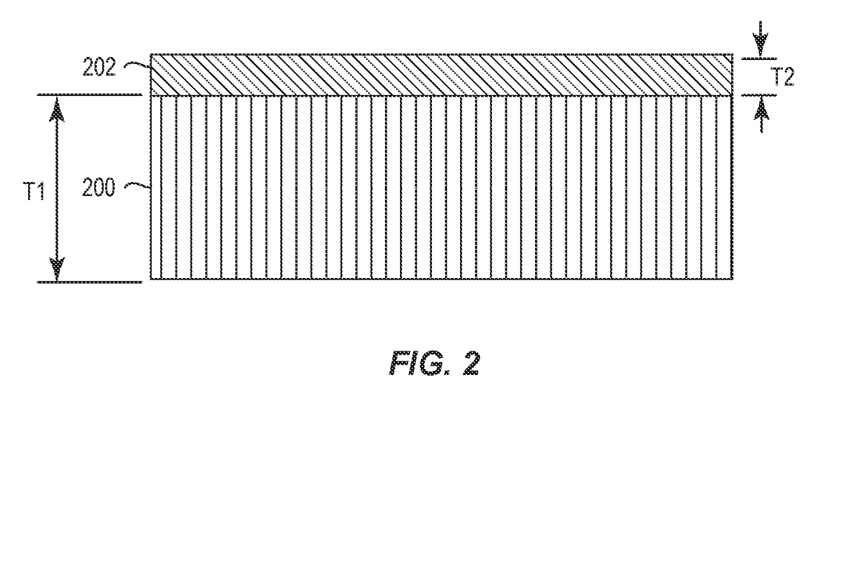
FIG. 2 illustrates a cross-sectional view of a device wafer with an adhesive material formed thereon in accordance with embodiments of the disclosure.

FIG. 2 illustrates a cross-sectional view of a device wafer 200 with an adhesive material 202 formed thereon in accordance with embodiments of the disclosure. The device wafer 200 has an initial (first) thickness T1. In a non-limiting nonexclusive example, the device wafer is a silicon wafer and T1 is approximately seven hundred and seventy (770) micrometers. Other embodiments can use a different type of device wafer, such as a silicon-on-insulator (SOI) wafer. Additionally or alternatively, the device wafer may have a thickness that is greater than or less than seven hundred and seventy (770) micrometers.

The adhesive material 202 is coated over the device wafer 200 to have a uniform or a substantial uniform thickness T2 across the surface of the device wafer 200. In certain embodiments, the device wafer 200 is circular in shape, so the thickness T2 is substantially uniform across a diameter of the device wafer 200. In a non-limiting nonexclusive example, T2 is approximately thirty (30) micrometers and the adhesive material 202 has a coating thickness uniformity of approximately seven-tenths (0.7) micrometers TTV. In other embodiments, the adhesive material can have a different thickness and/or TTV.

Returning to FIG. 1, a carrier wafer is bonded to the device wafer (block 104) after the adhesive material is coated over the surface of the device wafer. In certain embodiments, an air pressurized bonding chamber is used to produce a high-pressure uniformity of the adhesive material across the device wafer, and a TAZMO™ thermal bonding tool is used to bond the carrier wafer and the device wafer. In a non-limiting nonexclusive example, a total pressure of twelve thousand (12,000) Newtons (N) was used at two hundred degrees Celsius to bond the carrier wafer and the device wafer.

Figure 3:
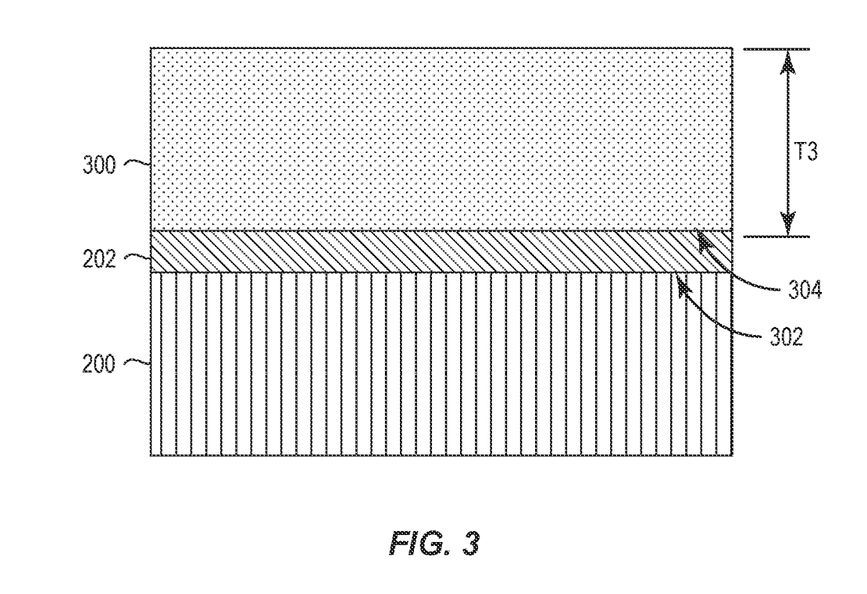
FIG. 3 illustrates a cross-sectional view of the device wafer and the adhesive material shown in FIG. 2 with the addition of a carrier wafer in accordance with embodiments of the disclosure.

FIG. 3 illustrates a cross-sectional view of the device wafer 200 and the adhesive material 202 shown in FIG. 2 with the addition of a carrier wafer 300 in accordance with embodiments of the disclosure. In the illustrated example, the adhesive material 202 is formed over a frontside surface 302 of the device wafer 200, and the carrier wafer 300 is attached to a frontside surface 304 of the adhesive material 202. The carrier wafer 300 has a thickness T3. In a non-limiting nonexclusive example, the carrier wafer 300 is a silicon wafer and T3 is approximately seven hundred and seventy (770) micrometers. Other embodiments can use a different type of carrier wafer, such as a carrier wafer made of glass or quartz. Additionally or alternatively, the carrier wafer 300 may have a thickness that is greater than or less than seven hundred and seventy (770) micrometers.

Referring again to FIG. 1, a first grinding process is performed to thin the device wafer (block 106). One or more first grinding parameters associated with the first grinding process may be received, determined and/or adjusted before and/or during the first grinding process. The one or more first grinding parameters can be adjusted continuously or at select times during the performance of the first grinding process. Non-limiting nonexclusive example first grinding parameters are an rpm of a spindle of a grinding tool, a wheel type used in the grinding tool, an rpm of a stage of the grinding tool, and/or a tilt of the stage of the grinding tool (e.g., a stage or table inclination). For example, the tilt of the stage can be adjusted or tuned to manipulate the removal rate of the device wafer material radially across the device wafer.

The first grinding process may be considered a rough or coarse grinding process. In certain embodiments, the TTV of the device wafer is monitored and controlled continuously or at select times during the first grinding process. One or more first grinding parameters may be adjusted based on the TTV during the first grinding process. For example, the rpm of the spindle may be adjusted based on the TTV and/or the type of wheel used in the grinding tool can be changed based on the TTV.

Figure 4:
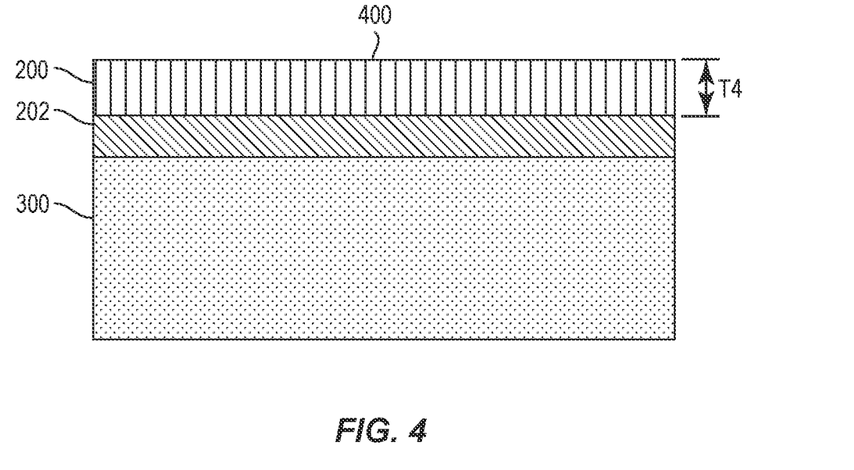
FIG. 4 illustrates a cross-sectional view of the structure shown in FIG. 3 after a first grinding process is performed in accordance with embodiments of the disclosure.

FIG. 4 illustrates a cross-sectional view of the structure shown in FIG. 3 after the first grinding process is performed in accordance with embodiments of the disclosure. The structure is shown flipped over such that the device wafer 200 is over the carrier wafer 300. The device wafer 200 is thinned from the first thickness T1 (FIG. 2) to a fourth thickness T4. In FIG. 4, the first grinding process is performed on a backside surface 400 of the device wafer 200. In a non-limiting nonexclusive example, T4 is approximately fifty (50) micrometers, and the first grinding process is performed using the Z1 spindle of a grinding tool with a spindle rpm of three thousand two hundred (3200) rpm and a forty-five (45) micrometer wheel grit size. In this non-limiting nonexclusive example, the device wafer 200 is thinned with a TTV of approximately one and a half (1.5) micrometers.

After the first grinding process is performed at block 106 in FIG. 1, a second grinding process is performed at block 108 to further thin the device wafer. One or more second grinding parameters associated with the second grinding process can be received, determined and/or adjusted before and/or during the performance of the second grinding process. The one or more second grinding parameters may be adjusted continuously or at select times during the performance of the second grinding process. Like the first grinding parameters, non-limiting nonexclusive example second grinding parameters are the rpm of a spindle of the grinding tool, the wheel type used in the grinding tool, the rpm of the stage of the grinding tool, and/or the tilt of the stage of the grinding tool (e.g., a table inclination).

The second grinding process can be considered a fine grinding process. In certain embodiments, the TTV of the device wafer is monitored and controlled continuously or at select times during the performance of the second grinding process. One or more of the second grinding parameters may be adjusted based on the TTV of the device wafer during the second grinding process. For example, the rpm of the stage of the grinding tool can be adjusted and/or the tilt of the stage of the grinding tool may be adjusted to produce a particular grind uniformity (or a substantially particular grind uniformity).

In certain embodiments, the TTV that is used for the first grinding process (a "first TTV") differs from the TTV that is used for the second grinding process (a "second TTV"). In a non-limiting nonexclusive example, the first TTV of the device wafer is one and a half (1.5) micrometers and the second TTV of the device wafer is one (1) micrometer. In other embodiments, the first TTV is the same as the second TTV.

Figure 5:
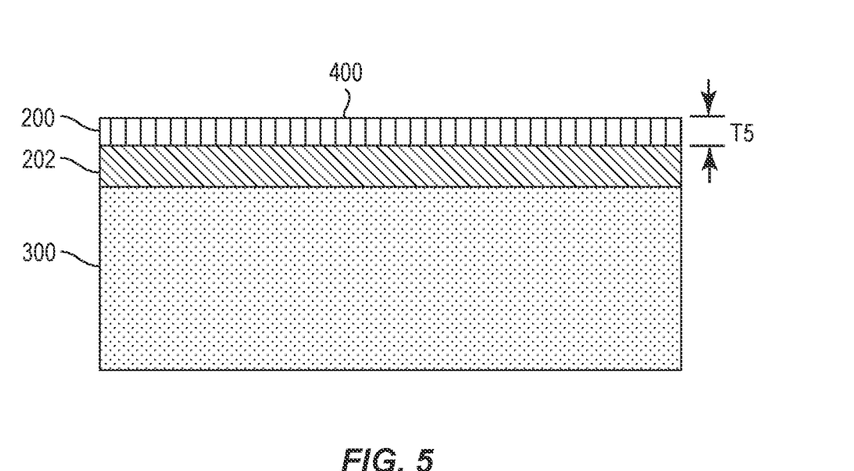
FIG. 5 illustrates a cross-sectional view of the structure shown in FIG. 4 after a second grinding process is performed in accordance with embodiments of the disclosure.

FIG. 5 illustrates a cross-sectional view of the structure shown in FIG. 4 after the second grinding process is performed in accordance with embodiments of the disclosure. The device wafer 200 is thinned from the thickness T4 to a fifth thickness T5. Like in FIG. 4, the second grinding process is performed on the backside surface 400 of the device wafer 200. In a non-limiting nonexclusive example, T5 is approximately five (5) micrometers to seven (7) micrometers, and the second grinding process is performed using the Z2 spindle of the grinding tool with a spindle rpm of three thousand (3000) rpm and a four (4) micrometer wheel grit size. In this non-limiting nonexclusive example, the device wafer is thinned to a TTV of approximately one and a half (1.5) micrometers. Thus, the second grinding process in the illustrated example thins the thickness of the device wafer 200 from approximately fifty (50) micrometers to approximately five (5) micrometers to seven (7) micrometers.

Returning to FIG. 1, a CMP process is performed at block 110 to further thin and/or polish the device wafer. One or more polishing parameters associated with the CMP process may be determined, received, and/or adjusted before and/or during the performance of the CMP process. The one or more polishing parameters can be adjusted continuously or at select times during the performance of the CMP process. Non-limiting nonexclusive example polishing parameters are a thickness profile of the device wafer, a slurry flow rate, an rpm of a polish head of a polishing tool, an rpm of a platen of the polishing tool, and/or one or more zonal pressures of the polish head in the polishing tool.

The thickness profile may be determined and adjusted before and/or during the performance of the CMP process. Adjustments of one or more polishing parameters can reduce or eliminate the formation of defects in the thinner region(s) of the post-ground device wafer due to punch-through during polishing. One or more zonal pressures of the polish head can be adjusted based on (e.g., to correct) the thickness profile. The CMP process may continue in this controlled manner until an average thickness at a given point on the device wafer (e.g., the center of the device wafer) is equal to or below a given thickness. In certain embodiments, the given thickness is less than ten (10) micrometers or greater than five (5) micrometers. In other embodiments, the given thickness is less than five (5) micrometers, is one (1) micrometer, or is less than one (1) micrometer.

Figure 6:
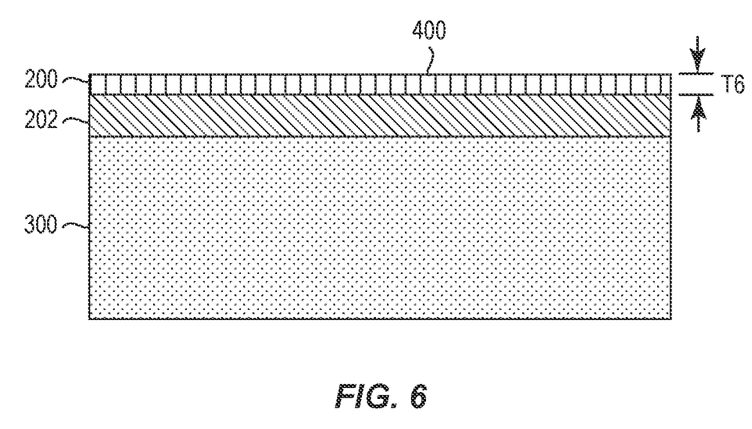
FIG. 6 illustrates a cross-sectional view of the structure shown in FIG. 5 after a CMP process is performed in accordance with embodiments of the disclosure.

FIG. 6 illustrates a cross-sectional view of the structure shown in FIG. 5 after the CMP process is performed in accordance with embodiments of the disclosure. The device wafer 200 is thinned from the thickness T5 to a sixth thickness T6. In the example embodiment, the CMP process is performed on the backside surface 400 of the device wafer 200. In a non-limiting nonexclusive example, the CMP process is performed using a four-zone polish head and a slurry with high selectivity to a dielectric material, such as silicon dioxide. In some embodiments, the CMP process thins the thickness of the device wafer 200 from approximately five (5) micrometers to seven (7) micrometers to approximately less than five (5) micrometers. In certain embodiments, the CMP process thins the thickness of the device wafer 200 from approximately five (5) micrometers to seven (7) micrometers to approximately one (1) micrometer or less than one (1) micrometer.

After the CMP process is performed, one or more additional processes can be performed at block 112 in FIG. 1. The additional processes may include forming active and/or passive components in the device wafer, forming an intermetal dielectric structure over a surface of the device wafer, and/or attaching the thinned device wafer to another component (e.g., a device wafer, an interposer) as part of a 3D integration process.

The carrier wafer is then removed at block 114. Any suitable method can be used to remove the carrier wafer. In a non-limiting nonexclusive example, the adhesive layer is removed using a laser or a thermal release process. Removal of the adhesive layer also removes the carrier wafer.

Figure 7:
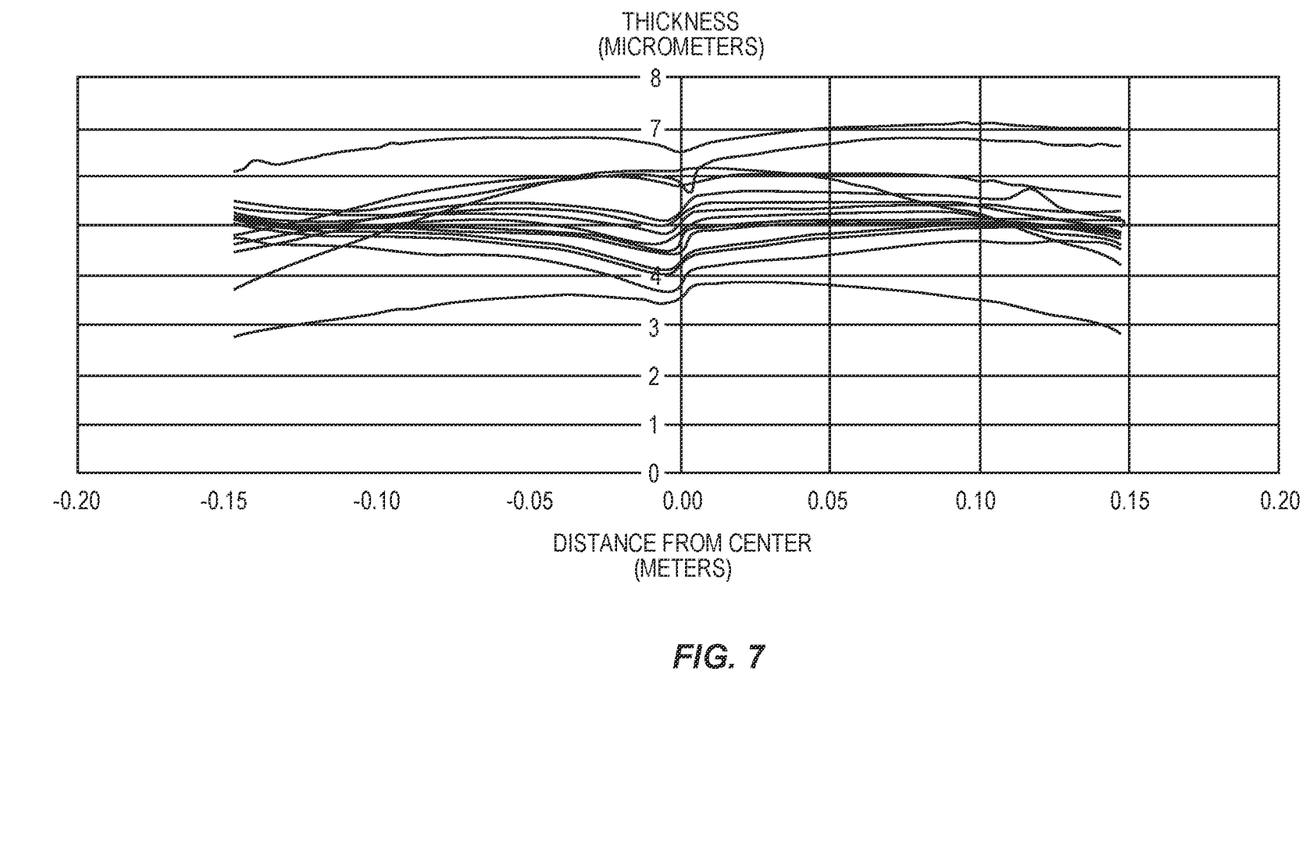
FIG. 7 illustrates example plots of wafer thickness profiles for multiple device wafers after the second grinding process is performed in accordance with embodiments of the disclosure.

FIG. 7 illustrates example plots of thickness profiles for multiple device wafers after the second grinding process is performed in accordance with embodiments of the disclosure. The vertical axis represents a thickness in micrometers and the horizontal axis represents a distance in meters from a center of the device wafer (point 0) to the edges of the device wafer. The example plots were produced for particular thicknesses that range between approximately three (3) micrometers to seven (7) micrometers.

Each plot is associated with a thickness across a respective device wafer. In certain embodiments, the device wafer is circular in shape, so the thickness across the device wafer is a thickness across the diameter of the device wafer. The example plots show the results of the two-step grinding process discussed herein. As shown, the one or more coating parameters and/or the monitoring of and adjustments to the first grinding parameters and/or the second grinding parameters provide a given repeatability of results for the two-step grinding process.

Figure 8:
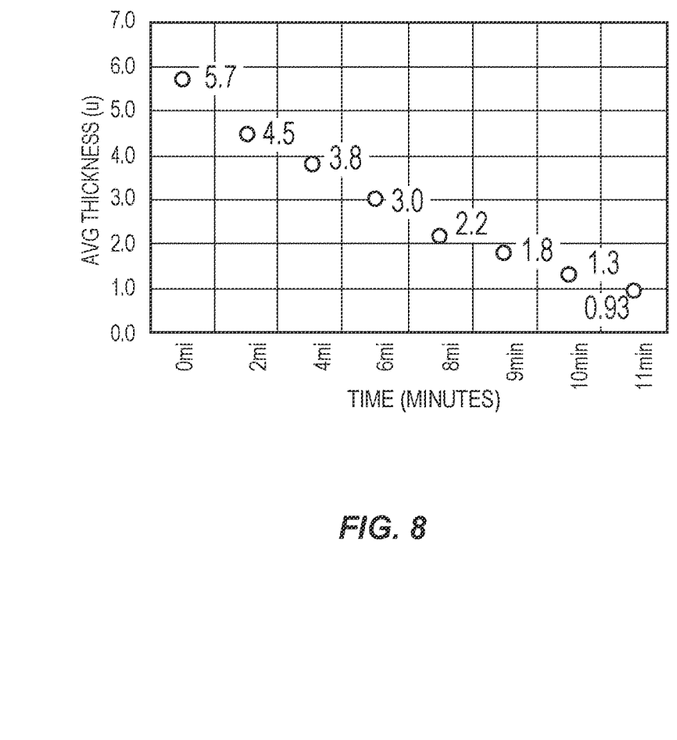
FIG. 8 illustrates example plots of an average wafer thickness for a device wafer before the CMP process is performed and during the performance of the CMP process in accordance with embodiments of the disclosure.

FIG. 8 illustrates example plots of an average device wafer thickness of a device wafer before the CMP process is performed and during the performance of the CMP process in accordance with embodiments of the disclosure. The average thickness is determined at a given point on the device wafer, such as at the center of the device wafer. The vertical axis represents an average thickness in micrometers and the horizontal axis represents time in minutes.

Prior to the CMP process, the device wafer has an average thickness of approximately five and seven tenths (5.7) micrometers. Two (2) minutes into the CMP process, the device wafer has an average thickness of approximately four and five tenths (4.5) micrometers. Four (4) minutes into the CMP process, the device wafer has an average thickness of approximately three and eight tenths (3.8) micrometers. Six (6) minutes into the CMP process, the device wafer has an average thickness of approximately three (3) micrometers. Eight (8) minutes into the CMP process, the device wafer has an average thickness of approximately two and two tenths (2.2) micrometers. Nine (9) minutes into the CMP process, the device wafer has an average thickness of approximately one and eight tenths (1.8) micrometers. Ten (10) minutes into the CMP process, the device wafer has an average thickness of approximately one and three tenths (1.3) micrometers. Eleven (11) minutes into the CMP process, the device wafer has an average thickness of approximately nine tenths (0.93) micrometers. As described earlier, one or more of the polishing parameters are adjusted at one or more select times to produce a thickness, or an average thickness, that is less than one (1) micrometer.

Figure 9:
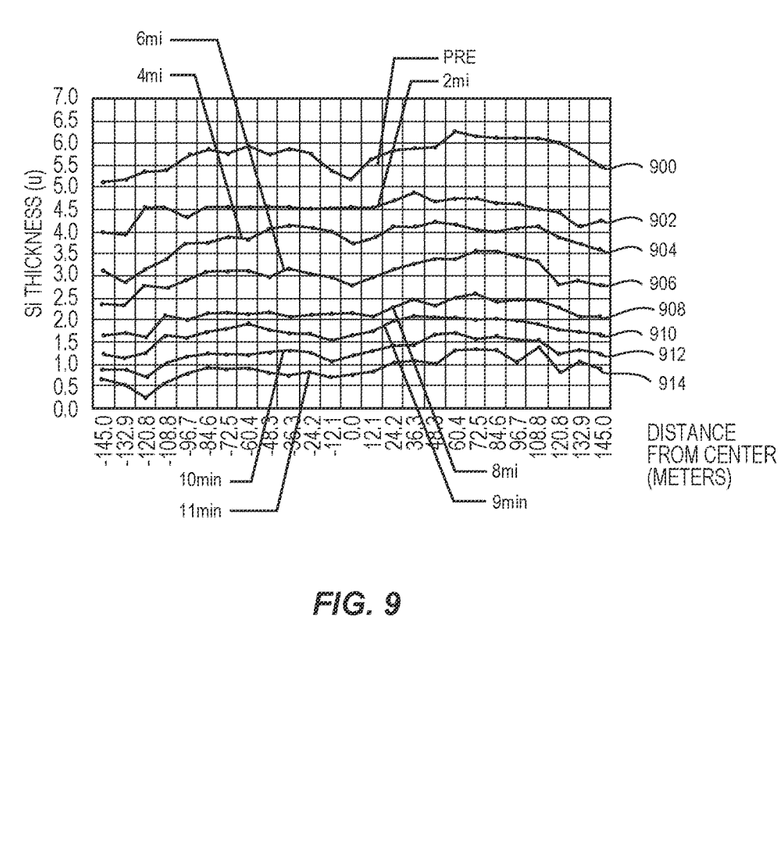
FIG. 9 illustrates example plots of the thickness profile of the device wafer before the CMP process is performed and during the performance of the CMP process in accordance with embodiments of the disclosure.

FIG. 9 illustrates example plots of the thickness profile of the device wafer before the CMP process is performed and during the performance of the CMP process in accordance with embodiments of the disclosure. The vertical axis represents the thickness in micrometers and the horizonal axis represents a distance in meters from the center of the device wafer to the edges of the device wafer. In the illustrated embodiment, the device wafer is circular in shape, so the thickness profile is across a diameter of the device wafer.

Each plot represents a time into the CMP process. For example, plot 900 represents the thickness profile of the device wafer prior to the start of the CMP process. The thickness profile in plot 900 is approximately between five (5) micrometers and six (6) micrometers. Plot 902 represents the thickness profile of the device wafer two (2) minutes into the CMP process. The thickness profile in plot 902 is approximately between four (4) micrometers and five (5) micrometers.

Plot 904 represents the thickness profile of the device wafer four (4) minutes into the CMP process. The thickness profile in plot 904 is approximately between three (3) micrometers and four (4) micrometers. Plot 906 represents the thickness profile of the device wafer six (6) minutes into the CMP process. The thickness profile in plot 906 is approximately between two and a half (2.5) micrometers and three and a half (3.5) micrometers.

Plot 908 represents the thickness profile of the device wafer eight (8) minutes into the CMP process. The thickness profile in plot 908 is approximately between one and a half (1.5) micrometers and two (2) micrometers. Plot 910 represents the thickness profile of the device wafer nine (9) minutes into the CMP process. The thickness profile in plot 910 is approximately between one and one quarter (1.25) micrometers and one and three quarters (1.75) micrometers.

Plot 912 represents the thickness profile of the device wafer ten (10) minutes into the CMP process. The thickness profile in plot 912 is approximately between one (1) micrometer and one and a half (1.5) micrometers. Plot 914 represents the thickness profile of the device wafer eleven (11) minutes into the CMP process. The thickness profile in plot 914 is approximately between one quarter (0.25) micrometer and one and one quarter (1.25) micrometers.

As shown in FIG. 9, each thickness profile has slight variations across the device wafer, but not significant variations. Plots 900, 902, 904, 906, 908, 910, 912, 914 illustrate a substantially consistent thickness profile during the performance of the CMP process. Plots 900, 902, 904, 906, 908, 910, 912, 914 do not include significant variations in the thickness profile. Plot 914 shows the thickness profile of the device wafer is approximately less than one (1) micron across the device wafer.

Figure 10:
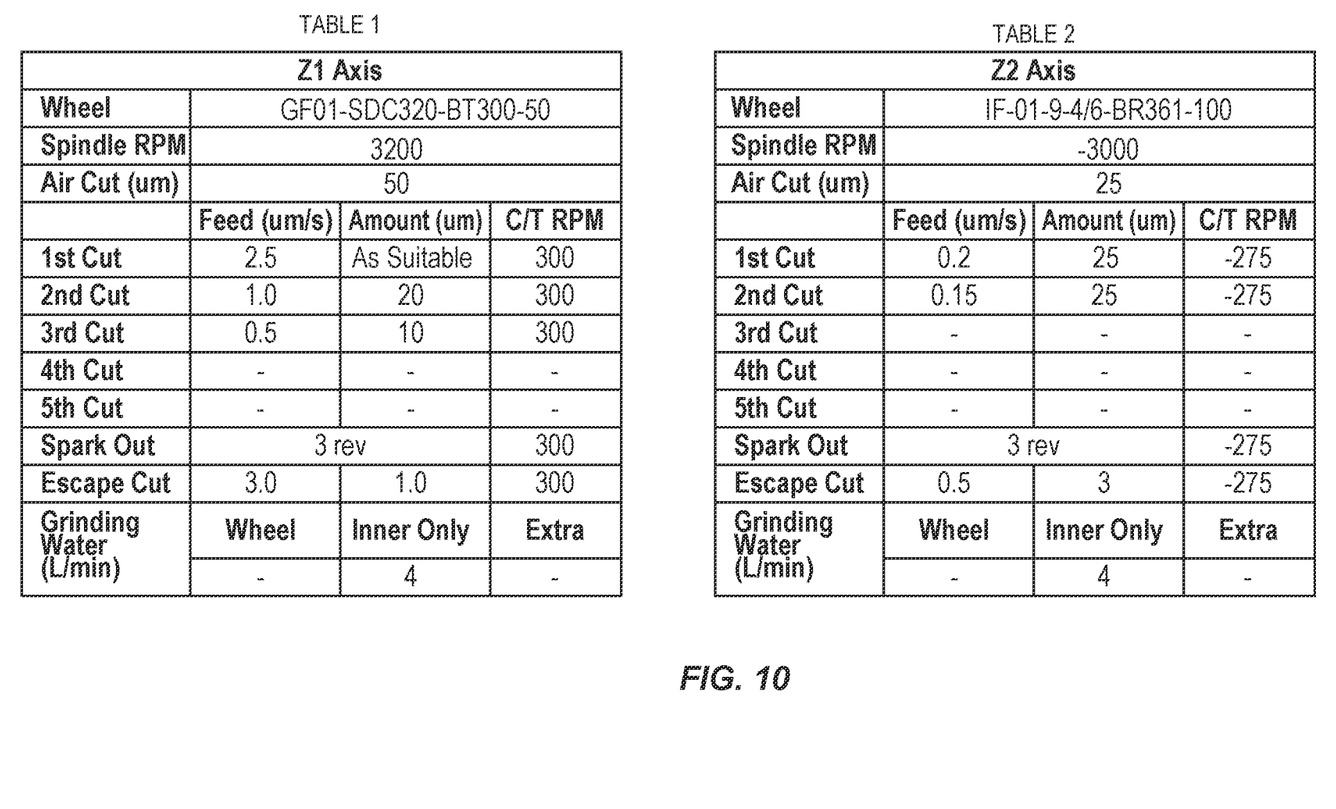
FIG. 10 illustrates example parameter settings for a grinder tool that is used for the first grinding process and the second grinding process in accordance with embodiments of the disclosure.

FIG. 10 illustrates example parameter settings for a grinder tool that is used for the first grinding process and the second grinding process in accordance with embodiments of the disclosure. The first grinding process is performed with the Z1 spindle (Table 1—Z1 Axis), and the second grinding process is performed with the Z2 spindle (Table 2—Z2 Axis). In FIG. 10, the Z1 spindle turns clockwise and the Z2 spindle turns counterclockwise. At least some of the parameter settings for the first grinding process are set and/or adjusted based on the first grinding parameters, and at least some of the parameter settings for the second grinding process are set and/or adjusted based on the second grinding parameters. Other grinder tools can use different parameter settings than those shown in FIG. 10.

Figure 11:
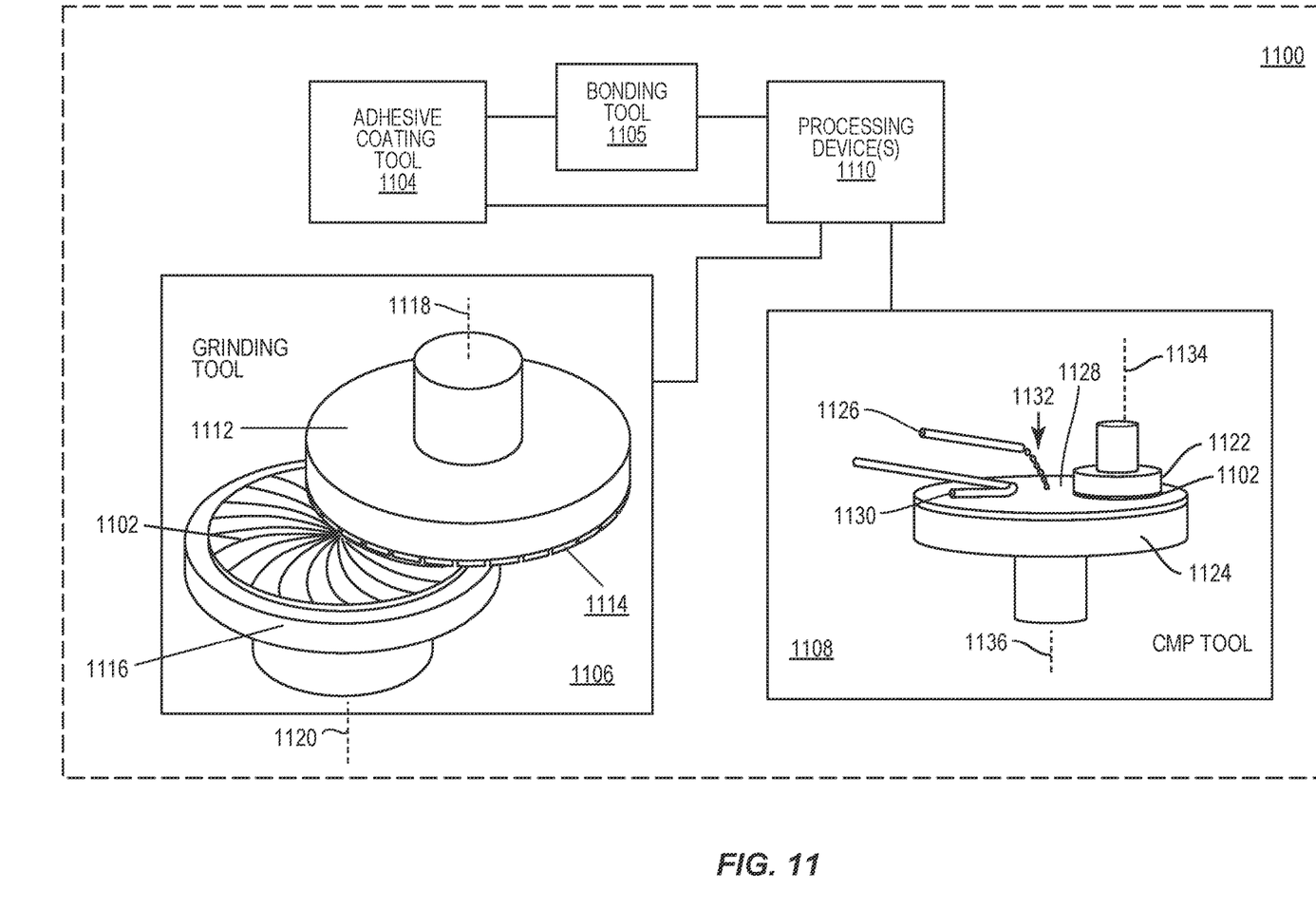
FIG. 11 illustrates an example system operable to thin a device wafer in accordance with embodiments of the disclosure.

FIG. 11 illustrates an example system 1100 operable to thin a device wafer 1102 in accordance with embodiments of the disclosure. The system 1100 includes an adhesive coating tool 1104, a bonding tool 1105, one or more grinding tools (collectively shown and referred to as a grinding tool 1106), and a CMP tool 1108. The system further includes one or more processing devices (collectively shown and referred to as a processing device 1110). In some embodiments, one or more of the adhesive coating tool 1104, the bonding tool 1105, the grinding tool 1106, and the CMP tool 1108 are implemented as one tool. For example, the adhesive coating tool 1104 and the bonding tool 1105 may be implemented together as one tool (e.g., as one tool). In another example, the grinding tool 1106 and the CMP tool 1108 are implemented together as one tool. In yet another example, the adhesive coating tool 1104, the bonding tool 1105, the grinding tool 1106, and the CMP tool 1108 are implemented together as one tool.

The processing device 1110 includes non-transitory computer-readable media that is operable to store processor-executable instructions that when executed by the processing device 1110, cause some or all of the operations disclosed herein to be performed by the adhesive coating tool 1104, the bonding tool 1105, the grinding tool 1106, and the CMP tool 1108. The processing device 1110 can be any suitable type of processing device or combinations of processing devices. In a non-limiting nonexclusive example, the processing device 1110 is a central processing unit, a microprocessor, a field programmable gate array, and/or an application specific integrated circuit.

In some embodiments, a single processing device is connected to the adhesive coating tool 1104, the bonding tool 1105, the grinding tool, 1106, and the CMP tool 1108. In other embodiments, a separate processing device is connected to each of the adhesive coating tool 1104, the bonding tool 1105, the grinding tool, 1106, and the CMP tool 1108 (e.g., four processing devices). In yet other embodiments, one processing device is connected to two of the adhesive coating tool 1104, the bonding tool 1105, the grinding tool 1106, and the CMP tool 1108 and another processing device is connected to the remaining of the adhesive coating tool 1104, the grinding tool, 1106, and the CMP tool 1108.

The adhesive coating tool 1104 is operable to coat (or cause to be coated) an adhesive material over or across a surface of a device wafer. As described earlier, one or more coating parameters associated with the coating process are determined, received, and/or adjusted prior to and/or during the coating process of the adhesive material. The one or more coating parameters may be adjusted continuously or at select times during the coating process. In certain embodiments, the one or more coating parameters include, but are not limited to, a coating thickness for the adhesive material, a spin speed of the adhesive coating tool 1104, a temperature of the adhesive material, and/or a viscosity of the adhesive material. Based on the one or more coating parameters, the adhesive coating tool coats the adhesive material onto the device wafer such that the adhesive material has a uniform or a substantially uniform thickness on the surface of the device wafer. In a non-limiting nonexclusive example, the adhesive coating tool 1104 is or includes an air pressurized bonding chamber to produce a high-pressure uniformity of the adhesive material across the device wafer.

The bonding tool 1105 is operable to bond a carrier wafer to the device wafer using the adhesive material. In certain embodiments, the bonding tool 1105 is a TAZMO™ thermal bonding tool.

The illustrated grinding tool 1106 includes a spindle 1112, a grinding wheel 1114, and a stage 1116. The grinding wheel 1114 is attached to the spindle 1112. The device wafer 1102 is placed on a surface of the stage 1116 and the spindle 1112 is pressed onto the device wafer 1102 to apply a downward pressure on the device wafer 1102 during a grinding process. The spindle 1112 is operable to rotate or spin along one or more axes (e.g., an axis 1118) and/or the stage 1116 is operable to spin along one or more axes (e.g., an axis 1120) during the grinding process. Additionally or alternatively, the stage 1116 is operable to tilt from a horizontal position (e.g., zero degrees) to a particular tilt angle. The grinding tool 1106 can be implemented as a single grinding tool or as multiple grinding tools. The grinding tool 1106 may be implemented with additional or different components in other embodiments.

The one or more first grinding parameters and the one or more second grinding parameters may each include, but are not limited to, a type of the grinding wheel 1114, the rpm of the stage 1116, a tilt of the stage 1116, and/or an rpm of the spindle 1112. In some instances, a first spindle is used in the first grinding process and a different second spindle is used in the second grinding process. In such embodiments, the rpm of the spindle is an rpm of the first spindle and an rpm of the second spindle.

The CMP tool 1108 includes a polish head 1122, a platen 1124, a slurry dispenser 1126, a polishing pad 1128 on a surface of the platen 1124, and a pad conditioner 1130. The device wafer 1102 is placed on a surface of the polishing pad 1128. A slurry 1132 is dispensed onto the surface of the polishing pad 1128 by the slurry dispenser 1126. The polish head 1122 is pressed onto the device wafer 1102 to apply a downward pressure on the device wafer 1102 during a CMP process. The downward pressure of the polish head 1122 is operable to apply the same zonal pressure across the device wafer 1102 or differing zonal pressures to select areas of the device wafer 1102. The pad conditioner 1130 is operable to maintain the surface roughness of the polishing pad 1128 and remove polishing debris. The polish head 1122 is operable to rotate or spin along one or more axes (e.g., an axis 1134) and/or the platen 1124 is operable to spin along one or more axes (e.g., an axis 1136) during the CMP process. The CMP tool 1108 may be implemented with additional or different components in other embodiments.

One or more polishing parameters can be determined, received, and/or adjusted before and/or during the performance of the CMP process. The one or more polishing parameters can include, but are not limited to, a thickness profile for the device wafer 200, a flow rate of the slurry 1132 by the slurry dispenser 1126, an rpm of the polish head 1122, an rpm of the platen 1124, and/or one or more zonal pressures of the polish head 1122.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method for thinning a device wafer, the method comprising:
performing a first grinding process to thin the device wafer from a first thickness to a second thickness, wherein the performance of the first grinding process comprises:
monitoring a first total thickness variation (TTV) of the device wafer during the performance of the first grinding process; and
adjusting at least one first grinding parameter during the performance of the first grinding process based on the monitored first TTV of the device wafer, wherein the first grinding process comprises a rough or coarse grinding process;
performing a second grinding process to thin the device wafer from the second thickness to a third thickness, wherein the performance of the second grinding process comprises:

monitoring a second TTV of the device wafer during the performance of the second grinding process; and adjusting at least one second grinding parameter during the performance of the second grinding process based on the monitored second TTV of the device wafer, wherein the second grinding process comprises a fine grinding process; and performing a chemical mechanical polish (CMP) process to thin the device wafer from the third thickness to a fourth thickness, wherein at least one polishing parameter associated with the CMP process is adjusted during the performance of the CMP process based on a thickness profile for the device wafer.

2. The method of claim 1, wherein the monitored first TTV differs from the monitored second TTV.

3. The method of claim 1, wherein the fourth thickness is less than one (1) micrometer.

4. The method of claim 1, wherein the fourth thickness is less than five (5) micrometers.

5. The method of claim 1, wherein:
the second thickness is fifty (50) micrometers; and
the third thickness is five (5) to seven (7) micrometers.

6. The method of claim 1, wherein a TTV of the device wafer after the performance of the CMP process is less than the fourth thickness.

7. The method of claim 1, wherein the at least one polishing parameter comprises:
the thickness profile;
a slurry flow rate;
a revolutions per minute (rpm) of a polish head of a polishing tool;
an rpm of a platen of the polishing tool; or
one or more zonal pressures of the polish head of the polishing tool.

8. The method of claim 1, further comprising:
prior to the performance of the first grinding process, receiving one or more coating parameters for an adhesive material, the one or more coating parameters comprising a coating thickness, a spin speed, and a temperature of the adhesive material, and/or a viscosity of the adhesive material; and
based on the one or more coating parameters, coating the adhesive material onto the device wafer.

9. The method of claim 8, further comprising bonding a carrier wafer to the device wafer.

10. The method of claim 1, wherein the at least one first grinding parameter comprises:
a wheel type in a grinding tool;
a revolutions per minute (rpm) of a stage of the grinding tool;
a tilt of the stage of the grinding tool; or
an rpm of a spindle of the grinding tool.

11. The method of claim 10, wherein the rpm of the spindle comprises an rpm of a first spindle of the grinding tool.

12. The method of claim 1, wherein the at least one second grinding parameter comprises:
a wheel type in a grinding tool;
a revolutions per minute of (rpm) of a stage of the grinding tool;
a tilt of the stage of the grinding tool; or
an rpm of a spindle of the grinding tool.

13. The method of claim 12, wherein the rpm of the spindle comprises an rpm of a second spindle of the grinding tool.

\* \* \* \* \*